United States Patent [19]

Cuomo et al.

[11] Patent Number: 5,206,213
[45] Date of Patent: Apr. 27, 1993

[54] METHOD OF PREPARING ORIENTED, POLYCRYSTALLINE SUPERCONDUCTING CERAMIC OXIDES

[75] Inventors: Jerome J. Cuomo, Lincolndale; Charles R. Guarnieri, Somers; Eugene S. Machlin, Croton-On-The-Hudson; Ronnen A. Roy, Briarcliff Manor; Dennis S. Yee, Pleasantville, all of N.Y.

[73] Assignee: International Business Machines Corp., Armonk, N.Y.

[21] Appl. No.: 498,180

[22] Filed: Mar. 23, 1990

[51] Int. Cl.$^5$ ............................................. B05D 3/02
[52] U.S. Cl. ........................................ 505/1; 505/733; 505/742; 427/62; 427/375; 427/419.3; 427/454; 427/576; 427/529
[58] Field of Search ............... 505/736, 731, 732, 733, 505/742; 427/34, 38, 62, 63, 423, 375, 419.3; 156/620.7, 616.1

[56] References Cited

U.S. PATENT DOCUMENTS

| | | | |
|---|---|---|---|
| 4,921,833 | 5/1990 | Takano | 505/1 |
| 4,988,672 | 1/1991 | Severin et al. | 505/1 |
| 5,071,828 | 12/1991 | Greuter et al. | 505/1 |

FOREIGN PATENT DOCUMENTS

| | | |
|---|---|---|
| 0292959 | 11/1988 | European Pat. Off. |
| 0301656 | 2/1989 | European Pat. Off. |
| 64-38916 | 2/1989 | Japan |
| 64-38917 | 2/1989 | Japan |

OTHER PUBLICATIONS

G. Dousselin et al., "Sputter Deposition of Superconducting 1-2-3/2-1-1 YBaCuO bilayers, Characterization and Etch-Patterning Procedure", *Materials Letters*, vol. 8, No. 10, pp. 436–440 (Oct. 1989).
Abstract No. 111:246 243 g of Japanese Pat. No. 1,125,878 (S. Tsucha et al) (May 18, 1989) Chemical Abstracts, vol. 111, No. 26, p. 903 (Dec. 25, 1989).
Neiser et al, "Plasma Sprayed Superconducting Oxides" Mat. Sci. and Eng., 91 (Jul. 1987) L13–15.
Tachikawa et al, "Fabrication of Superconducting Y—Ba—Cu Oxide through an improved diffusion process," Jpn. J. Appl. Phys. 27(8) Aug. 1988 L1501–1503.
Severin et al, "Superconducting YBa$_2$Cu$_3$O$_x$ thin layers by solid state diffusion", Mat. Res. Bull. vol. 23 (May 1988) pp. 707–717.
Miaoulis et al, "Zone-melting processing of thick high--Tc superconducting films", J. Phys. D: Applied Physics v. 22(6) Jun. 1989 pp. 864–867.
Mantese et al "Rapid Thermal annealing of high Tc superconducting thin films formed by metalorganic deposition" Appl. Phys. Lett. 52(19) May 1988, pp. 1631–1633.
Smith et al, "Silicon–on–insulator by graphoepitaxy and zone–melting recrystallization of patterned films", J. of Crystal Growth 63 (Mar. 1983) pp. 527–546.
Mannhart, Chaudhari, Dimos, tsuei and McGuire, "Critical Currents in [001] Grains and across Their Tilt Boundaries in YBa$_2$Cu$_3$O$_7$ Films", Phys. Rev. Lett. 61 pp. 2476–2479 (Nov. 1988).
Malik, Nair, Biswas and Raghavan, "Textile Formation and Enhanced Critical Current in YBa$_2$Cu$_3$O$_7$", Appl. Phys. Lett. 52 (18), pp. 1525–1527 (May 2, 1988).

(List continued on next page.)

*Primary Examiner*—Shrive Beck
*Assistant Examiner*—Roy V. King
*Attorney, Agent, or Firm*—Ratner & Prestia

[57] ABSTRACT

A process for the preparation of oriented, ceramic oxides from a bilayer structure of a polycrystalline superconducting ceramic oxide and a second ceramic oxide material having a lower melting point than the superconducting ceramic oxide. The process comprises the steps of preparing a substrate, depositing the superconducting ceramic oxide and second ceramic oxide in alternate layers, and heat treating the resulting composite structure to obtain an oriented structure whereby the c-axes of the unit cells of the crystallites are predominantly normal to the surface of the substrate.

25 Claims, 7 Drawing Sheets

OTHER PUBLICATIONS

Chaudhari, Koch, Laibowitz, McGuire & Gambino, "Cricital Current Measurements in Epitaxial Films of $YBa_2Cu_3O_{7-x}$ Compound", Phys. Rev. Lett. 58, pp. 2684–2686 (Jun. 1987).

Yee, Gambino, Chisholm, Cuomo, Madakson and Karasinski, "Critical Current and Texture Relationship in $YBa_2Cu_3O_7$ Thin Films", AIP Conf. Proc. No. 165 pp. 132–140 (Nov. 1987).

Jin, Tiefel, Sherwood, Davis, van Dover, Kammlott, Fastnacht and Keith, "High Critical Currents in Y—Ba—Cu—O Superconductors", Appl. Phys. Lett. 52 (24), pp. 2074–2076 (Jun. 13, 1988).

Atwater, Smith and Gels, "Orientation Selection by Zone-Melting Silicon Films through Planar Constrictions", Appl. Phys. Lett. 41 (8), pp. 747–748 (Oct. 15, 1982).

Kaiser, Holtzberg, Chisholm, Worthington, "Growth and Microstructure of Superconducting $YBa_2Cu_3O_x$ Single Crystals," J. Crystal Growth 85, pp. 593–598 (Sep. 1987).

Jin, Sherwood, Gyorgy, Tiefel, van Dover, Fastnacht, and Davis, "Stable Suspension in Melt-Textured Y—Ba—Cu—O Superconductor," AT&T Bell Laboratories, N.J. 07974 pp. 1–10 (Nov. 1988).

Cuomo, Guarnieri, Shivashankar, Roy, Yee and Rosenberg, "Large Area Plasma Spray Deposited Superconducting $YBa_2Cu_3O_7$ Thick Films", Adv. Ceram. Mater. 2(3B). p. 422 (Sep. 1987).

Kaiser, Holtzberg, Scott and McGuire, "Growth of $YBa_2Cu_3O_x$ single crystals", Appl. Phys. Lett. 51 (13), pp. 1040–1042 (Sep. 28, 1987).

Barrett and Massalski, *Structure of Metals*, pp. 193–222 (Jan. 1966).

☐ Yttrium
△ Barium
● Copper
○ Oxygen

METHOD OF PREPARING ORIENTED, POLYCRYSTALLINE SUPERCONDUCTING CERAMIC OXIDES

BACKGROUND OF INVENTION

A. Field of Invention

The present invention relates generally to oriented, polycrystalline, high-temperature superconducting ceramic oxides and, more particularly, to a process for preparing such superconductors from bilayer structures.

B. Description of Related Art

Superconductors are materials that, at sufficiently low temperatures and for sufficiently weak magnetic fields, have zero electrical resistivity. Absent electrical resistivity and the heat such resistivity creates, it would theoretically be possible for a superconductor to carry very large currents. As the current carried by a superconductor increases, however, a stronger and stronger magnetic field is self-generated until the critical magnetic field, above which the superconductor reverts to a normal conducting state with commensurate resistivity, is exceeded. Thus, there is a limit, the critical current density, to the amount of current a superconductor can carry.

High-temperature superconductors (those which superconduct above 77 Kelvin) are structurally related to the crystallographic family known as perovskites, ceramics that have a distinct atomic arrangement and that are found as common natural materials. Both natural and synthetic perovskites exhibit a wide range of electrical properties. One such property in the perovskites which are superconducting, the critical current density, is of great importance in the practical application of high-temperature superconductors.

Although the new, high-temperature superconductors have potential use at temperatures much higher than the extremely low temperatures required for superconduction by their older counterparts, they are inferior in other ways. Specifically, unlike older superconductors, the new, high-temperature superconductors lose their superconductivity under relatively small loads when polycrystalline and, consequently, are unable to carry sufficient current for practical applications. Researchers are now attempting to develop high-temperature superconductors having sufficiently high critical current densities for use in practical applications; no matter how high the critical temperature of a superconductor, it is practically useless unless able to support a useful flow of electric current.

A new, promising, high-temperature superconducting material is, for instance, the ceramic oxide $YBa_2Cu_3O_{7-x}$ ($0<x<0.5$). This material is designated the "123 superconductor" because the atomic ratios of Y:Ba:Cu are approximately 1:2:3. The 123 superconductor normally is a highly twinned orthorhombic phase, which is believed responsible for superconduction, and is closely related to a tetragonal, nonsuperconducting phase ($YBa_2Cu_3O_6$). The only significant difference between the nonsuperconducting, oxygen-deficient phase and the superconducting phase is the presence in the superconducting phase of Cu—O—Cu chains along the b-axis direction on the a-c faces of the unit cell.

The 123 superconductor, like many of the new, high-temperature superconductors, is anisotropic meaning that crystals of the material conduct current better in one direction than in other directions. Some high-temperature superconductors can carry current thirty times more readily in one direction than in another direction. Because superconductivity is inhomogeneous on an atomic scale and localized to specific layers, current in the 123 superconductor flows poorly in one direction (the vertical direction, or c-axis of the unit cell, where c is the longest unit cell dimension) and easily in two directions (the a-b plane). In a polycrystalline material, the structure consists of an assembly of small, individual crystallites, whose relative orientation to each other may vary. Thus, orientation of the individual crystals in a bulk sample (as opposed to a single crystal) of the polycrystalline material is critical in determining the electrical properties.

Moreover, additional metallurgical characteristics of the various phases and their interfaces (such as phase boundaries, grain boundaries, defects, and impurities) may limit the current-carrying capacity. For example, grains tend to line up randomly in bulk materials and current has a difficult time flowing through randomly oriented grains. J. Mannhart, P. Chaudhari, D. Dimos., C. C. Tsuei & T. R. Mc Guire, *Critical Currents in [001]Grains and Across Their Tilt Boundaries in $YBa_2Cu_3O_7$ Films*, Phys Rev. Lett. 61 2476 (1988). Impurities (such as the carbonates which form easily in Ba-containing compounds) lying between grains in bulk samples also make it harder for current to pass from grain to grain, which lowers the critical current density. Again, the growth orientation of the crystals in a polycrystalline material is important.

With proper, preferred orientation or texture of the crystals, a superconductor such as the 123 superconductor develops a path or track through its internal structure along which electrons are free to pass. The preferred orientation or texture has been shown for very thin films, those less than 1 micrometer thick, to have the c-axis perpendicular to the film surface. Such an orientation produces high critical current. Thus, the metallurgical formation of the material directly affects critical current density. Normally, when a thick 123 superconductor coating is deposited on a substrate material, as by plasma spraying, and is given a conventional heat treatment, the crystals form a random polycrystalline array.

For reasons discussed above, high critical current density can be obtained in the 123 superconductor only when there is a continuous current path along the base plane of the unit cell. Thus, a necessary condition to attain a high critical current density in polycrystalline superconducting ceramic oxides such as the 123 superconductor is to achieve the proper orientation in such materials. Specifically, the 123 superconductor must have an orientation in which the c-axis of the unit cell is oriented normal to the substrate material (and to the plane of the superconductor film). This condition is necessary but not sufficient to achieve high critical current density. It is also required that the remaining boundaries between grains have no greater misfit than is described by semi-coherent theory (i.e., there must be a significant fraction of coherent boundaries) and that the boundaries be free of impurities, inclusions, and all other foreign matter that hinders the super current transport.

A number of processes have been developed to produce oriented superconducting ceramic oxides like the 123 superconductor. One method consists of introducing an additive, $Ag_2O$, in powder form to the 123 superconductor ceramic oxide powder during processing. A modest increase in the critical current density by a factor of up to five is obtained. The increase is attributed to an increase in the orientation or texture (grain alignment) of the polycrystalline samples. M. K. Malik, V. D. Nair, A. R. Biswas & R. V. Raghavan, *Texture Formation and Enhanced Critical Current in $YBa_2Cu_3O_7$*, Appl. Phys. Lett. 52 (18), 1525–27 (May 2, 1988).

In another method, oriented thin films of 123 superconductors, with crystallites having the c-axis of the unit cell normal to the plane of the superconductor film, have been produced by sputtering and evaporation onto substrates such as $SrTiO_3$ and MgO. P. Chaudhari, R. H. Koch, R. B. Laibowitz, T. R. Mc Guire & R. J. Gambino, *Critical Current Measurements in Epitaxial Films of $YBa_2Cu_3O_{7-x}$ Compound*, Phys. Rev. Lett. 58, 2684 (1987); D. S. Yee, R. J. Gambino, M. Chisholm, J. J. Cuomo, P. Madakson & J. Karasinski, *Critical Current and Texture Relationships in $YBa_2Cu_3O_7$ Thin Films*, AIP Conf. Proc. No. 165, at 132 (J. M. E. Harper, R. J. Colton & L. C. Feldman eds. 1988) (from Topical Conference on Thin Film Processing and Characterization of High $T_c$ Superconductors, Anaheim, Calif., Nov. 8, 1987). The polycrystalline substrates which are typically used in plasma spray deposition processes, however, do not afford the possibility of such epitaxial growth.

In fact, the substrate or base layer must be carefully matched with the superconductor in existing thin film applications. Ideally, the substrate's crystalline structure should be identical to that of the superconductor so that the thin film can be deposited with a minimum of flaws and dislocations. Moreover, when the substrate interdiffuses with the superconductor during the annealing phase of processing, the superconductivity may degrade. Degradation may result because superconductors are very sensitive to an influx of foreign atoms. For example, interdiffusion can completely destroy superconductivity if the substrate contains even just a few percent silicon.

Melt-textured growth, or directional spherulitic growth, processing represents still another method available to achieve orientation. Conventional processing of ceramic oxide superconductors includes a sintering step in which the superconductor is fired at relatively low temperatures (about 700° C. for the 123 superconductor) to sinter individual grains together. The sintered material exhibits a somewhat porous, fine-grained, and randomly oriented microstructure.

Using melt-textured growth, in contrast, the superconductor is melted at very high temperatures (about 1050°–1200° C. for the 123 superconductor) and slowly cooled to obtain directional solidification. The resulting material consists of long, needle-like crystals and grains that are preferentially aligned in roughly the same direction. The material is also more dense and shows enhanced decomposition of unwanted impurities relative to the sintered material. These considerable microstructural changes, caused by the melt-textured growth process, are reflected in a significantly increased critical current density. S. Jin, T. H. Tiefel, R. C. Sherwood, M. E. Davis, R. B. van Dover, G. W. Kammlott, R. A. Fastnacht & H. D. Keith, *High Critical Currents in Y-Ba-Cu-O Superconductors*, Appl. Phys. Lett. 52(24), 2074–76 (June 13, 1988).

The melt-textured growth process produces large grain growth and induces significant (near 100%) densification. Such properties tend to cause microcracking during the processing step of cooling, because the material cannot absorb the stress of the change in crystalline structure as $YBa_2Cu_3O_6$ converts into $YBa_2Cu_3O_7$. Problems also arise in the final processing step: oxygenation is made more difficult by the dense microstructure. Both of these undesirable features limit the critical current density possible and adversely affect other properties as well.

One known heat treatment, described herein as the "pinch-off" procedure (zone melting of a film through a restriction), is of importance because it allows polycrystalline or amorphous films to recrystallize as single crystal (monocrystalline) films. H. A. Atwater, H. I. Smith & M. W. Geis, *Orientation Selection by Zone-Melting Silicon Films Through Planar Constrictions*, Appl. Phys. Lett. 41 (8), 747–49 (Oct. 15, 1982); H. I. Smith, M. W. Geis, C. V. Thompson & H. A. Atwater, *Silicon-On-Insulator by Graphoepitaxy and Zone-Melting Recrystallization of Patterned Films*, J. Crystal Growth 63, 527–46 (1983). This procedure is best explained by reference to FIGS. 1 and 2. Initially, the polycrystalline material, shown deposited on substrate 10 has relatively fine grains 12. By etching the material, using standard techniques (e.g., chemical, ion milling, and the like), gates 14 are formed. A narrow annealing (or "hot") zone 16 then is moved along the film surface (from left to right in the figures) and the annealing temperature is adjusted so the grains of the polycrystalline film grow (while in the annealing zone) into larger grains 18; the etched gates are formed so that the width of the gate opening or pinch-off zone 20 is slightly smaller than the grain size obtained during annealing.

The region with the larger growing grains is moved along the film surface along with the annealing zone. The gates restrict the number of grains, however, that grow and propagate along with the annealing zone. Thus, only a few (but larger) grains will propagate as the annealing zone passes the first gate. Fewer and fewer (larger and larger) grains propagate as the annealing zone passes subsequent gates until, finally, only a single (large) grain grows. The result is a single crystal film, 22. Thus, the heat treatment applied is seen to have a marked effect on the metallurgical formation of the material and, hence, on the critical current density.

To overcome the shortcomings of existing processes, a new process for preparing oriented, polycrystalline, superconducting ceramic oxides—and specifically the 123 superconductor—is provided. An object of this invention is to provide a process by which superconductor coatings having significantly improved critical current densities can be made. A related object is to improve the c-axis orientation of the material.

Another object is to provide the improved orientation without incorporating foreign additives such as $Ag_2O$ during the process. It is still another object of the present invention to provide a texturing process which is not a sensitive function of the cooling rate and which does not interfere with required processing steps such as oxygenation. It is a further object to transform amorphous or random polycrystalline films on polycrystalline substrates into oriented films (either polycrystalline or monocrystalline) while, at the same time, preventing microcracking.

Yet another object of this invention is to provide a process of making oriented superconducting materials having high critical current densities which is independent of the substrate material and its crystal orientation or texture.

Still another object is to provide an oriented, superconducting coating which can itself act as a base layer to facilitate the deposition of another oriented, high-temperature, superconducting oxide by conventional methods and which will prevent contamination of the new superconducting overlayer by providing a barrier to interaction with the underlying substrate as well as by matching the composition of the oriented base layer to that of the overlayer.

SUMMARY OF THE INVENTION

To achieve these and other objects, and in view of its purposes, the present invention provides a process for making an oriented, polycrystalline, superconducting ceramic oxide from a bilayer structure of a superconducting ceramic oxide and a second ceramic oxide material having a lower melting point than the superconducting ceramic oxide. The process comprises the steps of:

(a) preparing a substantially smooth substrate;

(b) forming a bilayer structure having a polycrystalline superconducting ceramic oxide layer and a second ceramic oxide layer alternately arranged by sequential deposition on the substrate; and (c) heat treating the composite structure of substrate and bilayer structure to obtain an oriented structure whereby the c-axes of the unit cells of the crystallites are predominantly normal to the surface of the substrate.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings, in which.

DETAILED DESCRIPTION OF THE INVENTION

Figure 1:
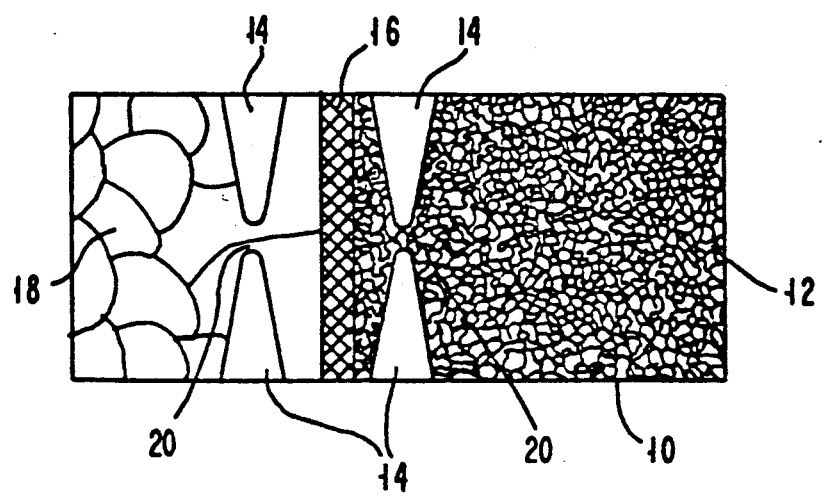
FIG. 1 illustrates the conventional "pinch-off" procedure and shows the effect of that procedure for a partially annealed film.
Figure 2:
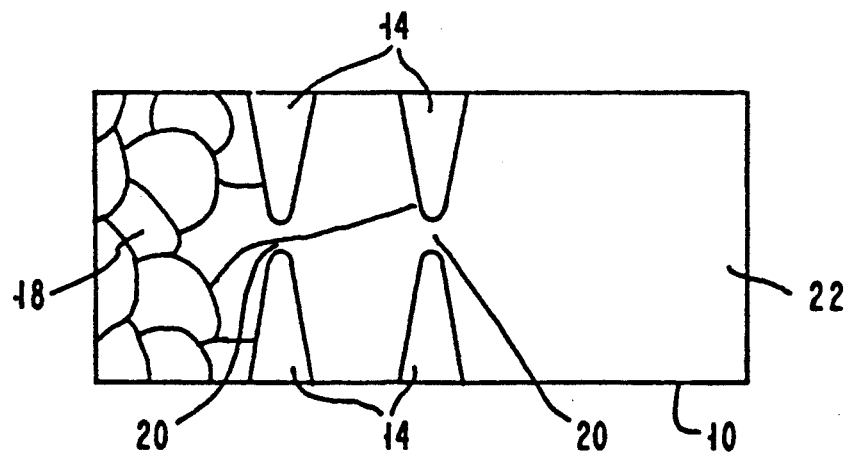
FIG. 2 further illustrates the conventional "pinch-off" procedure and shows the final structure resulting from that procedure.
Figure 3:
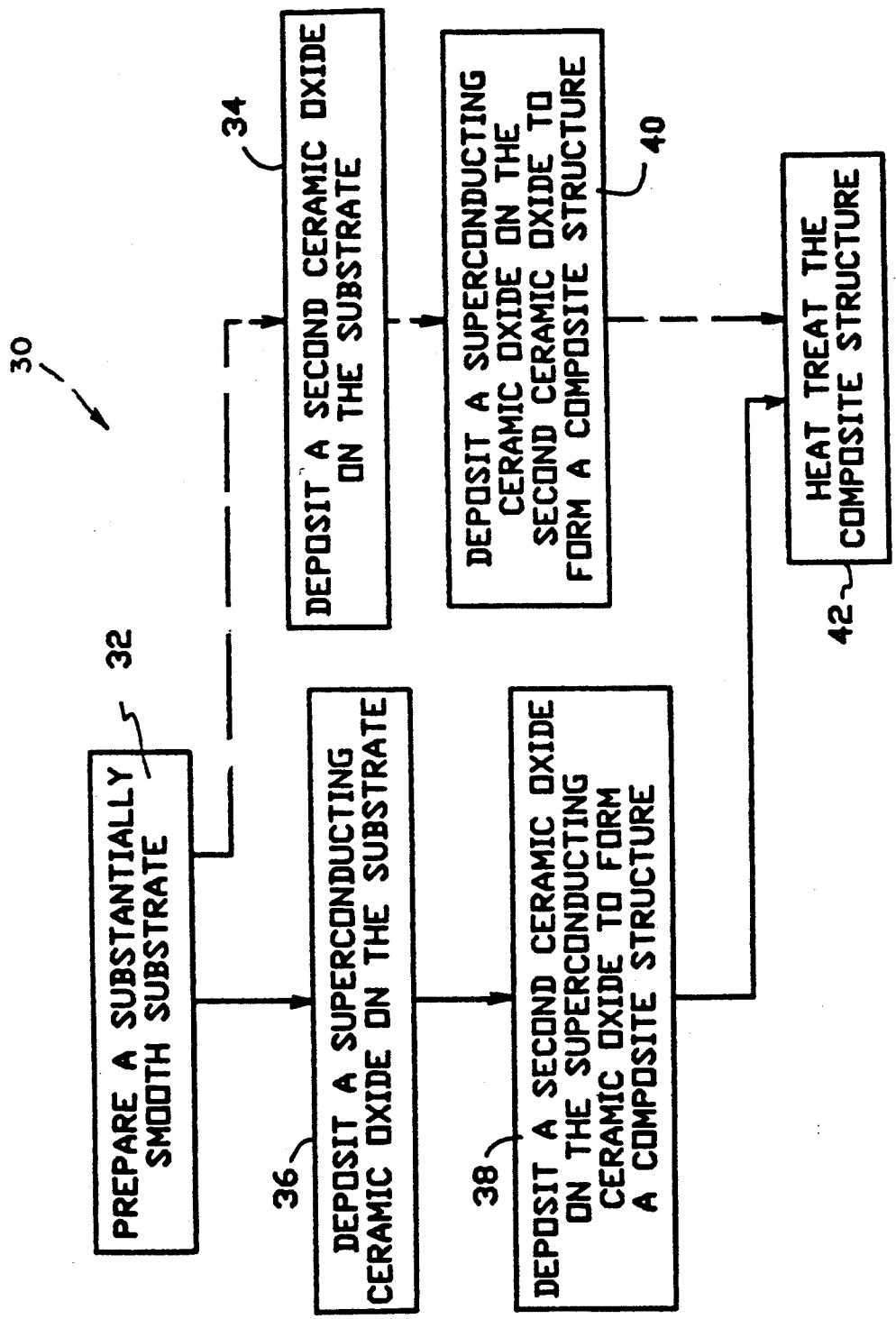
FIG. 3 is a flow chart illustrating the process of the present invention.

Shown in FIG. 3 is a flow diagram 30 of the steps of the process of preparing an oriented superconducting ceramic oxide in accordance with the invention. The first step is to prepare a substrate 32, or base layer, which will support and protect the oriented superconductor.

The substrate may be chosen from the class of substrates normally used in electronic packages, such as alumina, because the orientation of the superconductor will be independent of the substrate chosen and the substrate's orientation. Alternatively, the substrate may be chosen from any other class of materials, such as metals, to provide properties (i.e., the strength needed in wire for magnetic coils, a difference in thermal expansion to place the superconducting oxide in compressive stress on cooling from its heat treatment temperature, or the like) which are supplementary to the high critical current density of the superconducting material. Surface smoothnesses typically supplied for packaging applications, or smoother, are suitable for the substrate. Thus, trough to peak heights of roughness should be much less than the thickness of the individual layers to be deposited on the substrate.

A bilayer structure is then deposited on the substrate. This structure is composed of a superconducting ceramic oxide and a second ceramic oxide material. The second ceramic oxide material has a lower melting point than the superconducting ceramic oxide and preferably has a composition substantially similar to that of the superconducting ceramic oxide. The mechanism by which the oriented structure is obtained, as presently understood and as described below, makes it important that the second ceramic oxide material have the same components as those of the superconducting ceramic oxide and that it act as a solvent for the superconducting phase.

The bilayer structure may be deposited on the substrate in either of two ways. According to the preferred embodiment, the superconducting ceramic oxide is deposited on the substrate first, in step 36. Over the superconducting ceramic oxide layer is then deposited the second ceramic oxide in step 38. In an alternative embodiment, the second ceramic oxide is deposited on the substrate first, in step 34, and the superconducting ceramic oxide layer is then deposited over the second ceramic oxide in step 40.

The superconducting ceramic oxide layer is preferably deposited as a film having a thickness of about $1 \times 10^{-3}$ inches (25 micrometers). The thickness of the second ceramic oxide film, as deposited, is preferably about one to three times the thickness of the superconducting ceramic oxide layer. The relative thicknesses of the two layers should be such that the second ceramic oxide layer acts as a solvent for the superconducting phase. If an insufficient amount of the second ceramic oxide layer is present, it will not act as a solvent; if too much of that second layer is present, the result is either isolated superconducting 123 grains or an overly thin superconducting layer after cooling.

Deposition of both the superconducting ceramic oxide and the second ceramic oxide layers is preferably accomplished by plasma spray deposition. Other deposition processes may be used in place of the plasma spray deposition process, however, including, by way of example, evaporation, sputtering (diode, magnetron, ion beam), and dual ion beam.

Following deposition of the bilayer structure on the substrate, a composite structure of substrate, superconducting ceramic oxide (or second ceramic oxide), and second ceramic oxide (or superconducting ceramic oxide) is formed. That composite structure is then heat treated according to pre-determined times and temperatures, step 20, to obtain an oriented structure whereby the c-axes (the (001) direction) of the unit cells of the crystallites are predominantly normal to the surface of the substrate. When such an orientation is obtained, a maximum critical current density for a particular magnetic field strength results.

Incorporating the conventional pinch-off procedure described above as the heat treatment of step 20, an oriented, monocrystalline, high-temperature superconducting ceramic oxide may be produced. The composite structure of substrate and oriented, polycrystalline superconducting coating is etched to form a series of gates. An annealing zone, in which the second ceramic oxide becomes liquid, is then passed through the coating and along the substrate from one end of the substrate to its opposite end. The result is an oriented film that is monocrystalline.

Once a composite structure of substrate and oriented superconducting coating (polycrystalline or monocrystalline) is obtained, it is also possible to use that composite structure itself as a base (or substrate). Thus, another superconducting ceramic oxide layer, such as the 123 superconductor, may be deposited over the oriented superconducting coating by conventional deposition methods. (Alternatively, another oriented superconducting layer may be deposited according to the process of the present invention.) The advantage of such a process is that the oriented superconducting coating will prevent contamination of the newly deposited superconducting ceramic oxide layer by the original substrate. Prevention is achieved because the oriented superconducting coating will provide a barrier against interaction with the underlying substrate and because the composition of the oriented superconducting coating may be matched with that of the newly deposited superconducting ceramic oxide.

The process of the present invention for producing oriented, high-temperature superconductors may be used to orient both blanket coatings or patterned superconducting lines such as those used in computer modules and chips and in particle detectors.

The following example of application of the process described above to form an oriented 123 superconductor is by way of illustration to further explain the principles of the invention. Other oriented superconductors may also be formed from oxides that comprise the solid phase of either a peritectic or eutectic, with which the liquid phases of such systems are in equilibrium, using the process according to the present invention. The example is merely illustrative and is not to be understood as limiting the scope and underlying principles of the invention in any way.

It is known that a $Yba_2Cu_3O_{7-x}$ ($0 < x < 0.5$) powder can be deposited to produce a polycrystalline film that remains superconducting above 77 Kelvin. The polycrystalline 123 superconductor is suitable as the superconducting ceramic oxide described in the process above. When the 123 superconductor is used as the superconducting ceramic oxide, the composition of the second ceramic oxide is chosen from within the triangular phase field defined by $BaCuO_2$, $CuO$, and $Yba_2Cu_3O_7$ of the ternary phase diagram 45 as shown in FIG. 4.

Figure 4:
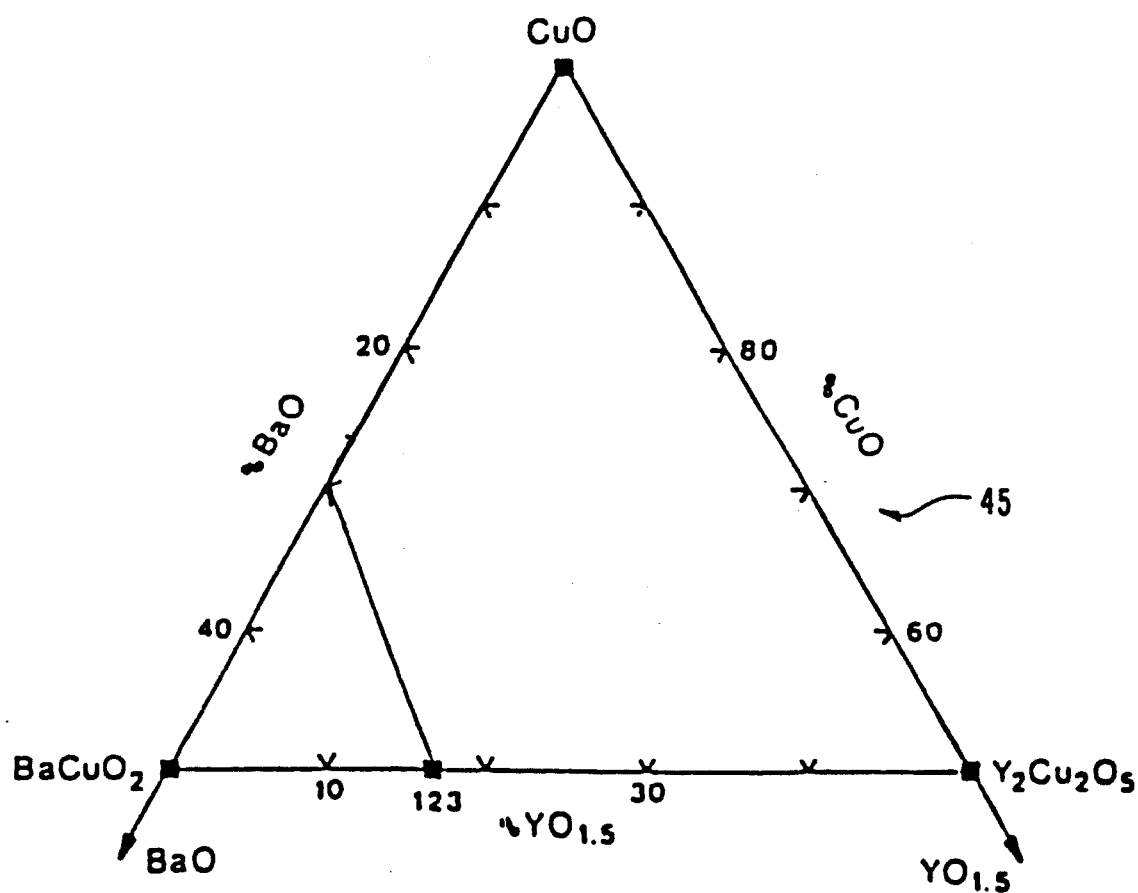
FIG. 4 depicts the pseudoternary subsystem 123-$BaCuO_2$-CuO of the ternary system $BaCuO_2$-$Y_2Cu_2O_5$-CuO.

Preferably, the second ceramic oxide has a composition approximately on a line in the ternary phase diagram of FIG. 4 connecting $(BaO)_{0.3}(CuO)_{0.7}$ on the BaO-CuO edge and the $Yba_2Cu_3O_7$ compound. Specific compositions of the second ceramic oxide materials suitable are $Y_{0.062}Ba_{0.28}Cu_{0.72}O_x$, $Y_{0.068}Ba_{0.28}Cu_{0.72}O_x$, and $Y_{0.026}Ba_{0.29}Cu_{0.71}O_x$. Other second ceramic oxide materials may be used.

Figure 5:
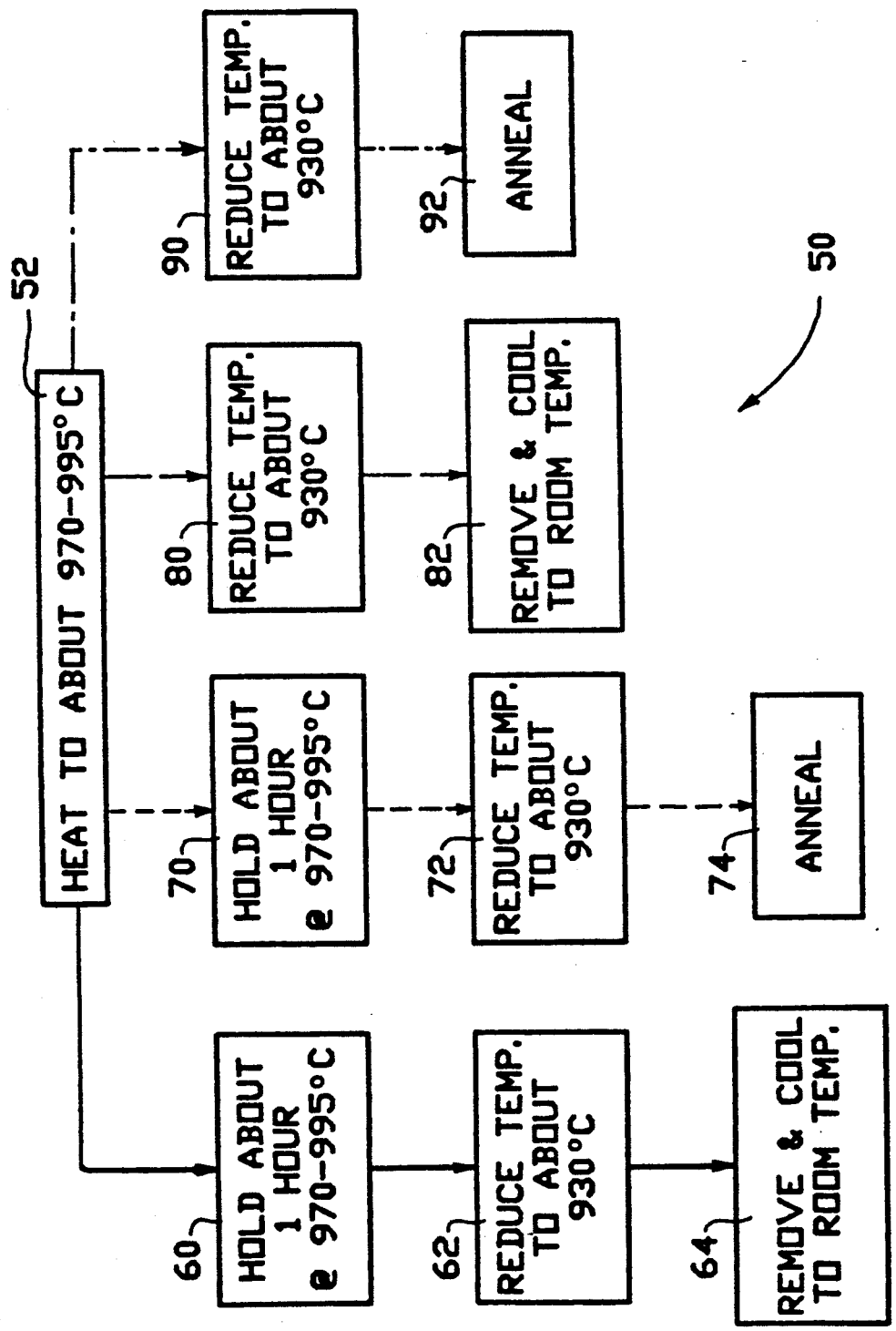
FIG. 5 is flow chart illustrating the preferred heat treating step as applied to one superconducting ceramic oxide, $YBa_2Cu_3O_7$.

Once the composite structure comprised of the substrate, 123 superconductor (or second ceramic oxide), and second ceramic oxide (or 123 superconductor) is formed, that composite is heat treated. The heat treatment may be done in air, in oxygen, or in other gases, such as helium, nitrogen, or argon. FIG. 5 illustrates the preferred heat treating process 50 as applied to the composite structure which includes the 123 superconducting ceramic oxide, $Yba_2Cu_3O_{7-x}$.

The first step 52 of the preferred heat treating process 50 involves heating the composite structure in a furnace to a temperature approximately in the range 970°-995° C. That temperature range is lower than the incongruent melting point of the 123 superconductor at about 1030° C. The temperature is above the melting point of the second ceramic oxide, however, to dissolve either an adequate amount of, or the entire, 123 superconductor layer. The temperature is then either reduced immediately to about 930° C. or held at temperature for about one hour before starting the cooling cycle. The cooling to 930° C. may be at a rate between about 10° to 60° C. per hour or, preferably, a more rapid thermal anneal may be used. The texturing treatment of the present invention is not, however, a sensitive function of the cooling rate. After reaching 930° C., the composite structure is either taken out of the furnace or given the anneal in oxygen required to produce a superconductor having a high critical temperature.

In combining the heat treatment steps just described, therefore, at least four combinations are possible. One combination is to hold the composite structure in the furnace for about an hour at a temperature approximately in the range 970°-995° C., step 60; reduce the temperature to about 930° C., step 62; then remove the composite structure from the furnace and cool the structure to room temperature, step 64. A second combination is to hold the composite structure in the furnace for about an hour at a temperature approximately in the range 970°-995° C., step 70; reduce the temperature to about 930° C., step 72; then anneal the structure, step 74.

A third combination involves reducing the temperature from the range 970°-995° C. to about 930° C. without first holding the composite structure in the furnace for about an hour at a temperature approximately in the range 970°-995° C., step 80, then removing the composite structure from the furnace and cooling the structure to room temperature, step 82. A fourth combination is reducing the temperature from the range 970°-995° C. to about 930° C. without first holding the composite structure in the furnace for about an hour at a temperature approximately in the range 970°-995° C., step 90, then annealing the structure, step 92.

The annealing steps 74 and 92 described above are performed in oxygen gas and involve rapidly cooling the composite structure from the temperature of about 930° C. to about 700° C., then slowly cooling the composite structure to room temperature. The superconducting, orthorhombic phase $Yba_2Cu_3O_{7-x}$ ($0<x<0.5$) is produced by oxidation of the oxygen-deficient, tetragonal phase $Yba_2Cu_3O_{6+x}$ ($0<x<0.5$) as the material is cooled through the tetragonal-to-orthorhombic transition. Performing the annealing steps 74 and 92 in oxygen allows formation of a material with uniform oxygen concentration. Accordingly, it is preferred that these steps be performed.

Although the heat treatments are described above as applied in a furnace or oven, they may also be accomplished in other modes of heating. For example, alternative modes are infared radiation, electron beam pulse, or laser pulse.

Figure 6:
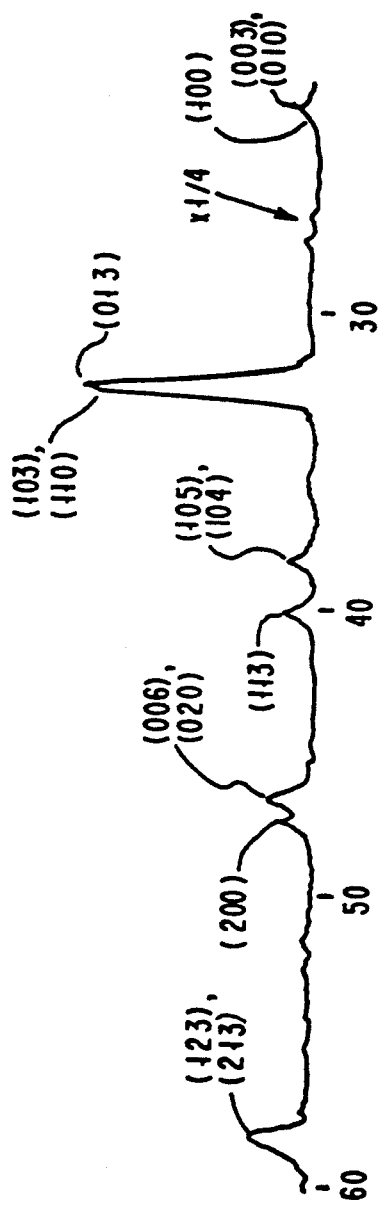
FIG. 6 shows a typical x-ray diffraction pattern of randomly arrayed $YBa_2Cu_3O_7$ crystals in a polycrystalline film as obtained after a standard anneal.

As conventionally deposited, coatings of the 123 superconductor may or may not exhibit a highly crystalline, well-developed crystal x-ray diffraction pattern. After a standard anneal and slow cooling to introduce and order the oxygen atoms in the 123 superconductor material, however, the x-ray diffraction pattern obtained is that typical of a random array of 123 superconductor crystals, regardless of the initial degree of crystallization. In other words, the films are polycrystalline. FIG. 6 depicts such a typical pattern, with several of the diffraction lines labeled.

Figure 7:
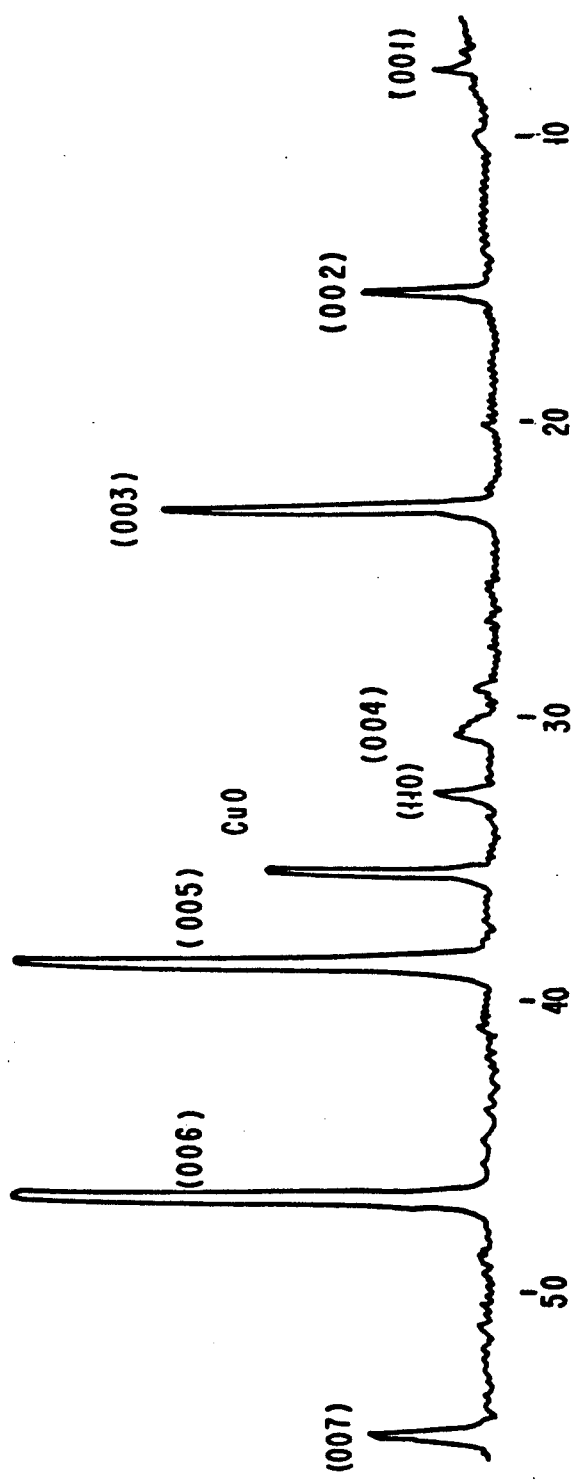
FIG. 7 indicates the x-ray diffraction pattern of an oriented $YBa_2Cu_3O_7$ film after processing according to the present invention.

After performing the preferred heat treatment described above for the composite structure comprising the 123 superconductor, the superconducting film reveals orientation. FIG. 7 indicates the x-ray diffraction pattern of an oriented $Yba_2Cu_3O_7$ film after processing according to the present invention. That pattern shows strong (001) reflections of $Yba_2Cu_3O_7$, most of which are more intense than the strongest line (103,110) in a pattern from randomly oriented $Yba_2Cu_3O_7$ (FIG. 6).

The degree of c-axis orientation can be estimated by comparing the sum of intensities of the (001) reflections with the sum of all the other reflections (hkl) in the x-ray diffraction pattern. In a randomly oriented material, the (001)/(hkl) ratio is approximately 0.15/1.0 (FIG. 6). In the oriented material of FIG. 7, however, the ratio is approximately 30/1.0, showing a 200-fold enhancement of c-axis orientation over a random sample. This demonstrates a preponderance of crystallites having their c-axes oriented near the film normal.

Figure 8:
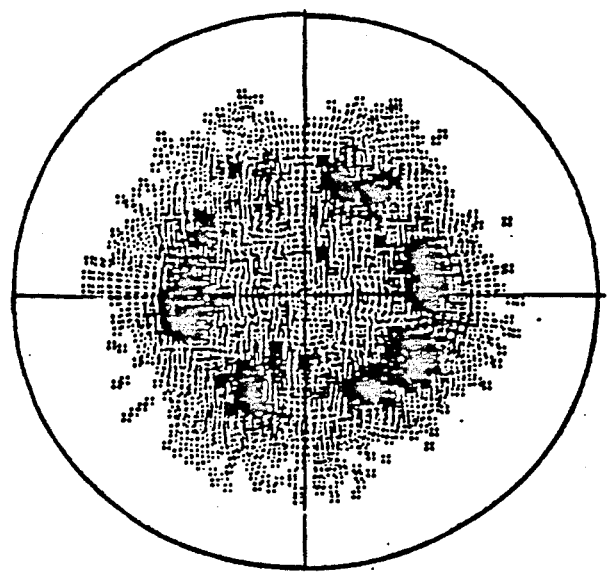
FIG. 8 depicts a typical pole figure using the (103) reflection for the oriented $YBa_2Cu_3O_7$ film after processing according to the present invention.

Lines corresponding to CuO are also present in the x-ray diffraction pattern of FIG. 7. A typical Schulz relection method pole figure obtained using the (103) reflection is shown in FIG. 8. Because there is a CuO diffraction line at the same 2Θ as the (103) diffraction line for $Yba_2Cu_3O_7$, care must be exercised when interpreting FIG. 8. The CuO diffraction line does not contribute to the orientation evident in FIG. 8. This has been demonstrated by examining the pole figure (not shown) for the (003) reflection where there is no interference from the CuO reflections. That figure showed an intense signal only at the center of the pole figure. Thus, the orientation is caused by $Yba_2Cu_3O_7$ and not by CuO.

Figure 9:
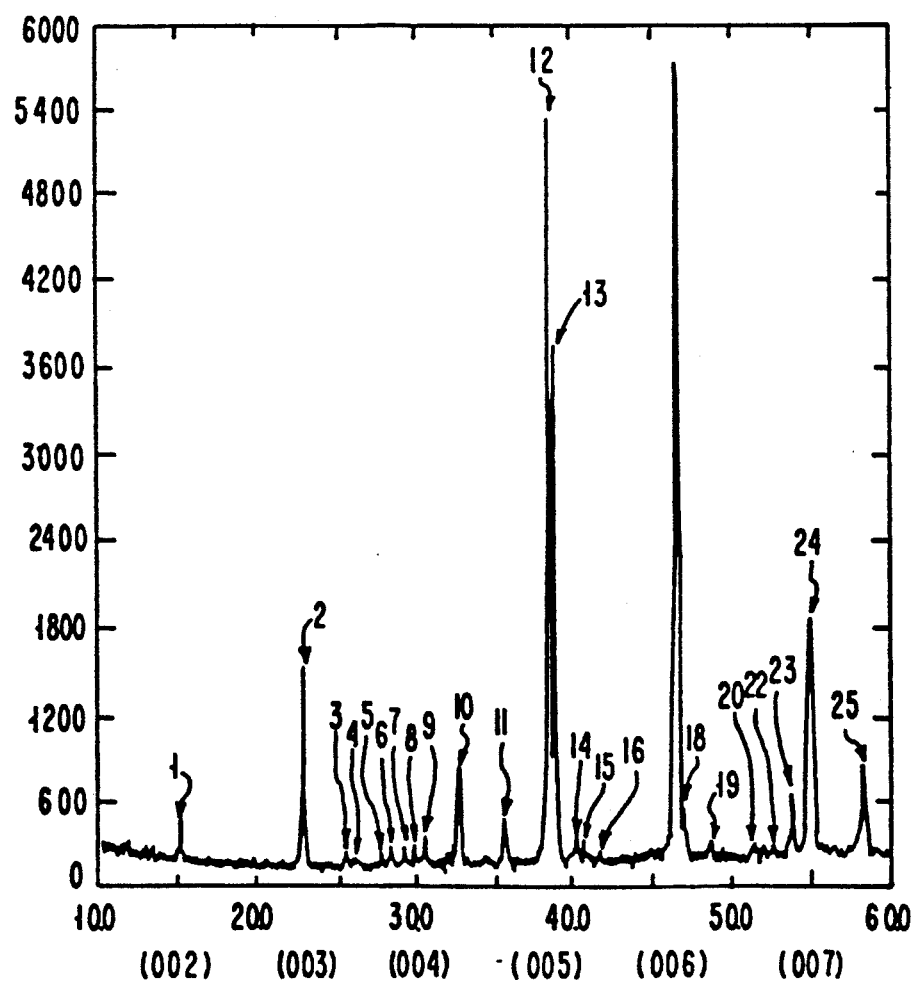
FIG. 9 is the $\Theta$-$2\Theta$ x-ray diffraction pattern for the film whose pole figure is shown in FIG. 6.

FIG. 9 is the Θ-2Θ x-ray diffraction pattern for the film whose pole figure is shown in FIG. 8.

The oriented result can be explained by considering the possible mechanisms driving the growth of the 123 superconductor crystals in the composite structure during heat treatment. The growth of the highly crystalline 123 superconductor film begins with growth from the melt. A large degree of melting at temperatures below the peritectic temperature (about 1030° C.) is obtained by preparing a bilayer structure with a Ba/Y ratio in the range between five and ten. From that bilayer structure, the $Yba_2Cu_3O_7$ is transported into the multiphase, lower melting point, liquid mixture.

The $Yba_2Cu_3O_7$ is then precipitated out on the surface of that liquid as cooling occurs. Although the $Yba_2Cu_3O_7$ phase comprises less than 50% of the overall film volume, the phase crystallizes in a layer above the melt because it has a lower density, because the surface is at a lower temperature, or both.

Figure 10:
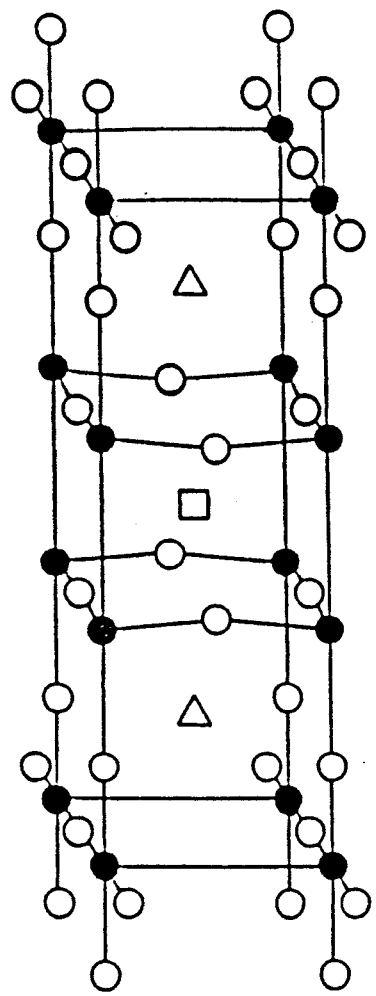
FIG. 10 illustrates the unit cell lattice structure for the $YBa_2Cu_3O_7$ material.

The c-axis orientation is believed to be controlled by anisotropy in the kinetics of atomic attachment and in the energetics during growth. With respect to growth kinetics, the direction parallel to the c-axis of the structure, where "c" is the longest unit cell dimension (the vertical direction in FIG. 10), appears to be the slowest growing. This phenomenon results in films with c-axis orientation having individual crystals where the ratio of the dimensions of the crystals parallel to the unit cell vectors "a" and "c", respectively, varies from three to over one hundred (the a-b plane is horizontal in FIG. 10). Thus, growth kinetics contributes to the orientation of the $Yba_2Cu_3O_7$ crystallites.

Figure 11B:
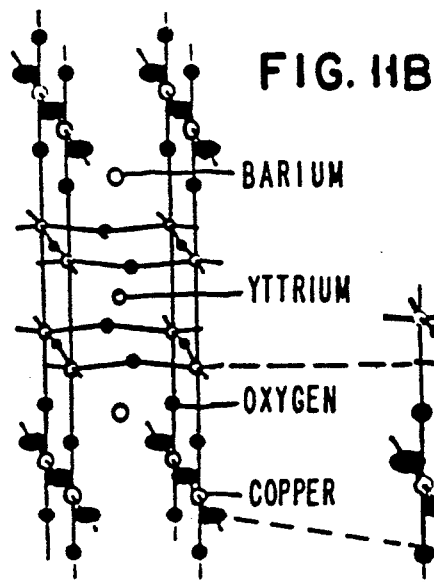
FIGS. 11A and 11B show the unit cell lattice structure for the $YBa_2Cu_3O_7$ material expanded in the a-b plane (horizontal direction).
Figure 11A:
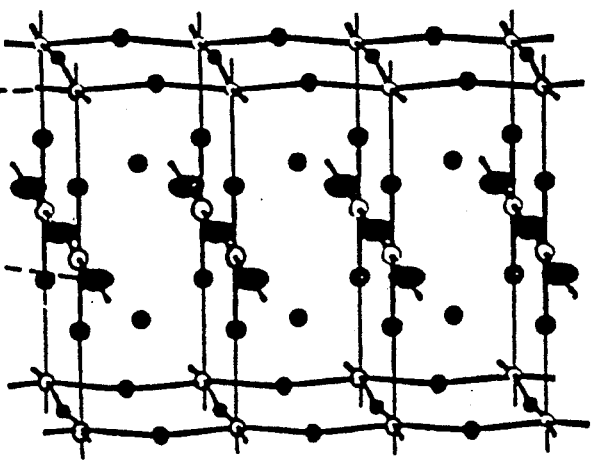

The desired orientation shows alignment of the $Yba_2Cu_3O_7$ grains, with the a-b planes of the orthorhombic crystal lattice (see FIGS. 11A and 11B) lying parallel to each other and to the substrate surface. This orientation contains $CuO_2$ planes parallel to the substrate surface which provide the pathways for carrying the current and give the oriented material a relatively high critical current density. In addition to alleviating random grain boundaries in the path of supercurrent flow and overcoming the problem of anisotropic superconductivity, the alignment is beneficial in resolving anisotropic thermal contraction and microcracking.

Although the invention is illustrated and described herein as embodied in a method for preparing an oriented, polycrystalline, superconducting ceramic oxide, it is nevertheless not intended to be limited to the details shown. Rather, various modifications may be made in the details within the scope and range of equivalents of the claims and without departing from the spirit of the invention.

What is claimed is:

1. A process for preparing an oriented superconducting ceramic oxide from a bilayer structure of an anisotropic polycrystalline superconducting rare earth alkaline earth copper ceramic oxide having a superconducting phase and a second rare earth alkaline earth copper ceramic oxide material having a lower melting point than the superconducting ceramic oxide comprising the steps of:

(a) preparing a substantially smooth substrate;
   (b) forming a bilayer structure having a polycrystalline superconducting ceramic oxide layer and a second ceramic oxide layer alternately arranged by sequential deposition on the substrate, said second ceramic oxide layer having a thickness enabling said second ceramic oxide layer to act as a solvent for said superconducting phase of said superconducting ceramic oxide layer; and
   (c) heat treating a composite structure of said substrate and said bilayer structure, initially to a temperature above the melting point of said second ceramic oxide and below the incongruent melting point of said superconducting ceramic oxide, to obtain an oriented structure having the c-axes of the unit cells of the crystallites predominantly normal to the surface of the substrate.

2. A process according to claim 1 further comprising the step of depositing a second superconducting ceramic oxide layer on the oriented structure.

3. A process according to claim 1 wherein the step of heat treating the composite structure further comprises etching the bilayer structure deposited on the substrate to create a plurality of gates in that structure, generating an annealing zone in the bilayer structure, and passing the annealing zone through the gates to form an oriented, monocrystalline, superconducting layer.

4. A process according to claim 1 wherein the superconducting ceramic oxide is deposited directly on top of the substrate and the second ceramic oxide material is deposited on the superconducting ceramic oxide.

5. A process according to claim 1 wherein the second ceramic oxide material is deposited directly on top of the substrate and the superconducting ceramic oxide is deposited on the second ceramic oxide material.

6. A process according to claim 1 wherein the step of depositing the superconducting ceramic oxide further comprises depositing the superconducting ceramic oxide as a film having a thickness of about $1 \times 10^{-3}$ inches.

7. A process according to claim 6 wherein the step of depositing the second ceramic oxide material further comprises depositing the second ceramic oxide material as a film having a thickness ranging from about 1 to 3 times the thickness of the superconducting ceramic oxide film.

8. A process according to claim 1 wherein the depositing steps further comprise forming layers of the second ceramic oxide material and the superconducting ceramic oxide by selecting deposition processes from the group consisting of plasma spraying, evaporating, sputtering, and dual ion beam depositing.

9. A process according to claim 1 wherein the second ceramic oxide material has a composition substantially similar to that of the superconducting ceramic oxide.

10. A process according to claim 1 wherein the superconducting ceramic oxide is $YBa_2Cu_3O_{7-x}$ ($0 < x < 0.5$).

11. A process according to claim 10 wherein the composition of the second ceramic oxide material is within the composition triangle defined by $BaCuO_2$, $CuO$, and $YBa_2Cu_3O_7$ of the ternary phase diagram, the second ceramic oxide material acting as a solvent at the annealing temperature for the $YBa_2Cu_3O_{7-x}$ ($0 < x < 0.5$) superconducting ceramic oxide.

12. A process according to claim 11 wherein the second ceramic oxide material has a composition approximately on a line in the ternary phase diagram connecting $(BaO)_{0.3}(CuO)_{0.7}$ on the BaO-CuO edge and the $YBa_2Cu_3O_7$ compound.

13. A process according to claim 10 wherein the step of heat treating further comprises a rapid thermal anneal.

14. A process according to claim 10 wherein the heat treating is performed in oxygen.

15. A process according to claim 10 wherein the step of heat treating further comprises heating in a furnace to a temperature approximately in the range 970°-995° C.

16. A process according to claim 15 wherein the step of heat treating further comprises:
(a) holding the composite structure in the furnace for about one hour at a temperature approximately in the range 970°-995° C.;
(b) reducing the temperature to about 930° C.;
(c) removing the composite structure from the furnace and cooling the composite structure to room temperature.

17. A process according to claim 15 wherein the step of heat treating the composite structure further comprises:
(a) holding the composite structure in the furnace for about one hour at a temperature approximately in the range 970°-995° C.;
(b) reducing the temperature to about 930° C.;
(c) annealing the composite structure.

18. A process according to claim 17 wherein the step of annealing the composite structure further comprises rapidly cooling the composite structure in oxygen to about 700° C. then slowly cooling the composite structure to room temperature.

19. A process according to claim 15 wherein the step of heat treating the composite structure further comprises:
(a) reducing the temperature to about 930° C.;
(b) removing the composite structure from the furnace and cooling the composite structure to room temperature.

20. A process according to claim 15 wherein the step of heat treating the composite structure further comprises:
(a) reducing the temperature to about 930° C.;
(b) annealing the composite structure.

21. A process according to claim 20 wherein the step of annealing the composite structure further comprises rapidly cooling the composite structure in oxygen to about 700° C. then slowly cooling the composite structure to room temperature.

22. A process for preparing an oriented superconducting ceramic oxide from a bilayer structure of an anisotropic polycrystalline superconducting rare earth alkaline earth copper ceramic oxide having a superconducting phase and a second rare earth alkaline earth copper ceramic oxide material having a lower melting point than the superconducting ceramic oxide comprising the steps of:
(a) preparing a substantially smooth substrate;
(b) depositing the second ceramic oxide material on the substrate to a thickness enabling said second ceramic oxide material to act as a solvent for said superconducting phase of said superconducting ceramic oxide;
(c) depositing the superconducting ceramic oxide on the second ceramic oxide material to form a composite structure of said substrate, said superconducting ceramic oxide, and said second ceramic oxide; and
(d) heat treating the composite structure, initially to a temperature above the melting point of said second ceramic oxide and below the incongruent melting point of said superconducting ceramic oxide, to obtain an oriented structure having the c-axes of the unit cells of the crystallites predominantly normal to the surface of the substrate.

23. A process for preparing an oriented superconducting ceramic oxide from a bilayer structure of an anisotropic polycrystalline superconducting rare earth alkaline earth copper ceramic oxide having a superconducting phase and a second rare earth alkaline earth copper ceramic oxide material having a lower melting point than the superconducting ceramic oxide comprising the steps of:
(a) preparing a substantially smooth substrate;

(b) depositing the superconducting ceramic oxide on the substrate;
(c) depositing the second ceramic oxide material on the superconducting ceramic oxide to a thickness enabling said second ceramic oxide material to act as a solvent for said superconducting phase of said superconducting ceramic oxide and to form a composite structure of said substrate, said superconducting ceramic oxide, and said second ceramic oxide; and
(d) heat treating the composite structure, initially to a temperature above the melting point of said second ceramic oxide and below the incongruent melting point of said superconducting ceramic oxide, to obtain an oriented structure having the c-axes of the unit cells of the crystallites predominantly normal to the surface of the substrate.

24. A process for preparing an oriented superconducting ceramic oxide from a bilayer structure of an anisotropic polycrystalline superconducting rare earth alkaline earth copper ceramic oxide having a superconducting phase and a second rare earth alkaline earth copper ceramic oxide material having a lower melting point than the superconducting ceramic oxide comprising the steps of:
(a) preparing a substantially smooth substrate;
(b) forming a bilayer structure having a polycrystalline superconducting ceramic oxide layer and a second ceramic oxide layer alternately arranged by sequential deposition on the substrate, said second ceramic oxide layer having a thickness enabling said second ceramic oxide layer to act as a solvent for said superconducting phase of said superconducting ceramic oxide layer;
(c) heat treating a composite structure of said substrate and said bilayer structure, initially to a temperature above the melting point of said second ceramic oxide and below the incongruent melting point of said superconducting ceramic oxide, to obtain an oriented structure having the c-axes of the unit cells of the crystallites predominantly normal to the surface of the substrate; and
(d) depositing a second superconducting ceramic oxide layer on the oriented structure.

25. A process according to claim 1 wherein said superconducting ceramic oxide and said second ceramic oxide each comprise a yttrium barium copper oxide.

* * * * *